United States Patent
Colpo et al.

(10) Patent No.: US 6,321,681 B1
(45) Date of Patent: Nov. 27, 2001

(54) METHOD AND APPARATUS TO PRODUCE LARGE INDUCTIVE PLASMA FOR PLASMA PROCESSING

(75) Inventors: Pascal Colpo, Annecy (FR); François Rossi, Biandronno (IT); Jean-François Daviet, Cran-Gevrier; Roland Ernst, Gieres, both of (FR)

(73) Assignee: European Community (EC) (LU)

( * ) Notice: Subject to any disclaimer, the term of this patent is extended or adjusted under 35 U.S.C. 154(b) by 0 days.

(21) Appl. No.: 09/341,705

(22) PCT Filed: Oct. 7, 1998

(86) PCT No.: PCT/EP98/06492

§ 371 Date: Sep. 20, 1999

§ 102(e) Date: Sep. 20, 1999

(87) PCT Pub. No.: WO99/19898

PCT Pub. Date: Apr. 22, 1999

(30) Foreign Application Priority Data

Oct. 10, 1997  (EP) .................................. 97402395
Apr. 10, 1998  (EP) .................................. 98400888
May 19, 1998  (EP) .................................. 98401199

(51) Int. Cl.$^7$ .............................. C23C 16/00; H05H 1/00
(52) U.S. Cl. ................ 118/723 I; 118/733; 156/345
(58) Field of Search ............... 118/723 I, 723 MA, 118/723 MR, 723 IR, 723 MW, 733, 345

(56) References Cited

U.S. PATENT DOCUMENTS

| | | |
|---|---|---|
| 3,702,493 | 11/1972 | Murphy . |
| 4,714,818 | 12/1987 | Mazac . |
| 5,167,716 | * 12/1992 | Boitnott et al. ................ 118/719 |
| 5,405,480 | 4/1995 | Benzing et al. . |
| 5,435,881 | 7/1995 | Ogle . |
| 5,587,038 | 12/1996 | Cecchi et al. . |
| 5,965,034 | * 10/1999 | Vinogradov et al. ............ 216/68 |
| 6,033,585 | * 3/2000 | Wicker et al. ................ 216/68 |

FOREIGN PATENT DOCUMENTS

| | | |
|---|---|---|
| 0 273 741 A | 7/1988 | (EP) . |
| 0 342 279 A | 11/1989 | (EP) . |
| 0 517 042 A | 12/1992 | (EP) . |
| 0 779 645 A | 6/1997 | (EP) . |

OTHER PUBLICATIONS

Patent Abstracts of Japan, vol. 098, No. 010, Aug. 31, 1998 & JP 10 125496 A (ADTEC:KK), May 15, 1998, see abstract.
Patent Abstracts of Japan, vol. 095, No. 011, Dec. 26, 1995 & JP 07 221533 A (Hitachi Metals Ltd), Aug. 18, 1995, see abstract.
Patent Abstracts of Japan, vol. 014, No. 559 (C–0787), Dec. 12, 1990 & JP 02 240250 A (Asahi Glass Co Ltd), Sep. 25, 1990, see abstract.
Patent Abstracts of Japan, vol. 097, No. 007, Jul. 31, 1997 & JP 09 080065 A (Sumitomo Electric Ind Ltd), Mar. 28, 1997, see abstract.
Patent Abstracts of Japan, vol. 015, No. 395 (P–1260), Oct. 7, 1991 & JP 03 157803 A (Fujitsu Ltd), Jul. 5, 1991, see abstract.
Patent Abstracts of Japan, vol. 096, No. 011, Nov. 29, 1996 & JP 08 195296 A (Matsushita Electric Ind Co Ltd), Jul. 30, 1996, see abstract.
Patent Abstracts of Japan, vol. 097, No. 005, May 30, 1997 & JP 09 025197 A (Canon Inc), Jan. 28, 1997, see abstract.

* cited by examiner

*Primary Examiner*—Gregory Mills
*Assistant Examiner*—P. Hassanzadef
(74) *Attorney, Agent, or Firm*—Bacon & Thomas

(57) ABSTRACT

A plasma processing apparatus comprises a processing chamber having at least one opening for receiving field energy by inductive coupling, and at least one field energy source arranged to induce the field energy into the chamber via the corresponding opening. The field energy source comprises an inductor device associated with a magnetic core. The magnetic core forms a closure and gas seal for the corresponding opening.

15 Claims, 4 Drawing Sheets

METHOD AND APPARATUS TO PRODUCE LARGE INDUCTIVE PLASMA FOR PLASMA PROCESSING

The present invention relates generally to apparatus and their use for surface treatments using plasma assisted processing and more particularly, but not exclusively, for the treatment of large flat substrates.

Such treatments can include etching, deposition, cleaning, passivation and ion implantation.

The new requirements for the plasma processing of large substrates become more and more critical for plasma sources available on the market. The success of the plasma assisted processing depends on the scalability of these plasma sources.

To fulfil these requirements, new plasma sources must be envisaged to process large substrates with plasma features like the generation of high densities of reactive species with low and controllable energy over a wide pressure range, and with an excellent homogeneity throughout the substrate.

Plasma processing generally uses a vacuum chamber connected to a gas inlet and a pumping device for controlling the gas flows and pressure. Electrical energy is applied to the vacuum chamber to accelerate the free electrons in the gases to the energy of ionization of the gas molecules, which thereby creates plasma. Ionization phenomena free some electrons which can also be accelerated to the ionization energy.

The added energy of the free electrons in the gas is generally accomplished by an electric field, a varying magnetic field, or both.

One traditional method used in plasma processing to generate plasma is by a technique known as called Capacitively Coupled Plasma. The plasma results from the application of an AC voltage between two electrodes creating an electric field which accelerate the free electrons. Generally, one of the two electrodes is the substrate holder. The applied energy generated by the AC voltage applied between the two electrodes controls at the same time the flux and kinetic energy of the ions. Because the two parameters are coupled, this process is difficult to optimise.

Another plasma source used in plasma processing is based on the Electron Cyclotron Resonance (ECR). In this process, microwave power is applied to the gas together with a constant magnetic field which transforms the electron paths into a circular path. The intensity of the magnetic field is such that the frequency of gyration of the electron is the same as the frequency of the electric field, which leads to a resonance effect increasing the efficiency of electron acceleration. This type of excitation mode can provide a plasma with high ion flux and low ion energy. The ion energy can be controlled by applying an independent bias to the substrate. However, such an apparatus is complex and expensive. Moreover, it is still too limited as regards the plasma expected processing expected features, in particular for scaling up and homogeneity of the plasma source.

A new generation of plasma source has been developed during the last years which give good promise. These are known as Inductively Coupled Plasmas (ICPs), such as described e.g. in U.S. Pat. Nos. 4,948,458 and 5,277,751. The plasma is created by a varying magnetic field generated by a spiral planar coil. The electrons are accelerated in a circular path parallel to the coil plane and the insulating window of the plasma chamber. This configuration provides a high density plasma with low kinetic energy, but has an inherent problem of homogeneity at the center and at the boundary of the coil when the size of the apparatus is increased. This problem limits the scability of the process.

U.S. Pat. No. 5,435,881 presents an apparatus for generating a suitably low pressure planar plasma. This apparatus comprises a two-by-two or a larger array of alternating magnetic poles (multipoles). The advantages cited in this patent are the possibility to generate a large plasma by adding more varying magnetic poles, therefore having very small area on non uniform plasma.

However, such a design creates a dependency between the spacing of the two-by-two magnetic poles and the excitation frequency as well as the in-use operation pressure. This spacing depends on the mean free path of the electrons which decreases when the pressure increases. Accordingly, when a high operating pressure is necessary for process requirements, the spacing between the two-by-two poles must be drastically decreased. This becomes critical from a technical point of view. The process also requires different multipole distributions for different process pressures, which decreases its flexibility and applicability to industrial applications.

It is therefore an object of the present invention to provide means to enable optimum plasma conditions to be obtained in a reliable manner, even when workpieces of large dimensions need to be processed.

According to a first aspect of the invention, there is provided an apparatus adapted for generating a time-varying magnetic field through a field admission window of plasma processing chamber to create or sustain a plasma within the chamber by inductive coupling, the apparatus being characterized in that it comprises:

a magnetic core presenting a unipolar pole face structure adapted to be applied against or in proximity to the window and having an active field emission area whose size and shape substantially matches the field emission window, and an inductor means associated with the magnetic core, for generating a substantially uniformly distributed time-varying magnetic field throughout the unipolar pole face structure.

The combination of a magnetic core with the inductor serves to increase and homogenize the magnetic field produced by the inductor, the magnetic flux lines being uniformly distributed over the pole face structure. This effect is particularly pronounced given that a typical core material that can be used in accordance with the invention would possess a very high permeability ($\mu$) e.g. in the region of 1000 or more. Such a material can be soft iron, an iron alloy or a ferrogmagnetic material. The latter can be in the form of a ceramic such as ferrite, or any other material. Irrespective of the material chosen, the core can be produced by a sintering process where appropriate.

The combination of the magnetic core and unipolar pole face structure ensures that the magnetic field does not have a "dead area" at the center of the inductor, as is usually the case with magnetic field energy sources based on just an inductor having a spiral path formed parallel to the plane of the chamber window.

As a result, the apparatus according to the first aspect of the present invention makes it possible to employ plasma processing chambers having large window areas and thereby to process correspondingly large workpieces under homogeneous plasma conditions throughout the active area. For instance, the present invention can be used for processing substrates of flat panel displays such as LCDs having dimensions of around 0.5 m square or more.

The magnetic core can easily be matched to the shape and dimensions of the window; it can present e.g. a circular, rectangular or polygonal unipolar pole face as required.

The window(s) of the processing chamber need not necessarily be flat, but may be curved, e.g. to follow the contour of a wall portion from which it/they depend(s). The magnetic core can likewise present a unipolar pole face structure configured to follow the curvature of the window(s) to provide uniform conditions inside the chamber.

Preferably, the unipolar face structure is constituted by a single pole face of unitary construction. In this way, the window of the plasma processing chamber is confronted with a substantially continuous surface, which further contributes to enhance uniformity.

It is nevertheless envisageable to divide the unipolar pole face structure into two or more unipolar pole faces that confront respective portions of the plasma processing chamber window. This alternative solution may be considered if the window area to be covered is particularly large. The pole faces may then be associated to respective inductors and power supplies whilst being kept in phase to ensure that all the pole faces have the same polarity at any one time. The unipolar pole faces may alternatively physically depend from a common magnetic core and inductor In a preferred construction, the pole face structure constitutes an end face of the magnetic core.

Advantageously, the magnetic core comprises at least one electrical discontinuity in a path along a plane parallel to the pole face so as to prevent the circulation of eddy currents around the core. Indeed, the magnetic flux lines passing through the magnetic core tend to create eddy currents that circulate in the plane of the pole face, by Lenz's law. If these currents were free to circulate around the core, they would create magnetic flux lines that oppose those generated by the coil, with the effect of diminishing the net magnetic field energy emitted from the pole face, and of creating undesirable heating of the core.

The discontinuity can be in the form of one or more laminations. The lamination(s) preferably extend radially from a point proximal to or at the centre of the core to the to the periphery thereof. The laminations may occupy the entire depth of the magnetic core, as measured in the direction perpendicular to the pole face structure.

The above problem of eddy currents is more pronounced in some core designs than in others depending, for instance on the core material used, and it may not always be necessary to provide such a discontinuity.

The inductor means typically comprises a conductor arranged to form one or more turns around at least a portion of the magnetic core. It may be wound around the periphery of the magnetic core. The inductor means may also comprise a planar winding recessed within a groove pattern formed in the magnetic core, e.g. at the pole face surface.

If the window of the process chamber is formed on curved walls, the pole face structure can be made non planar such as to follow the curvature of the field admission window to which it is associated.

The inductor means is driven by a power supply preferably delivering current at a frequency of around 10 kHz to 100 MHz, a typical operating frequency being 13.56 MHz. A circuit for impedance matching and phase factor correction can be provided between the power supply and the inductor if required.

The first aspect of the present invention also has for object a plasma processing apparatus comprising: a plasma processing chamber having at least one window, at least one aforementioned magnetic field generating apparatus arranged to create a time-varying magnetic in the chamber by inductive coupling through a corresponding window, and power source means for driving the magnetic field generating apparatus.

The first aspect of the present invention also concerns the use of the above plasma processing apparatus for processing a workpiece.

According to a second aspect of the present invention, there is provided an inductive type plasma processing chamber having two or more windows for receiving induced field energy, each window enabling induced field energy to enter the chamber from a respective direction.

The plasma processing chamber according to the second aspect of the invention makes it possible to provide optimum plasma conditions at two or more different faces of a workpiece or of a group of workpieces. The chamber can thus be used to process a large workpiece having multiple facets under excellent conditions of uniformity. It may also be used to process two or more workpieces simultaneously, for example a respective face of two or more substrates.

The plasma processing chamber may, for example, be provided with two oppositely-facing windows. If the chamber has a shallow configuration (circular or square cross-section), the windows may be provided at each end of the shallow walls, for example.

If the chamber has an elongate configuration (circular or square cross-section) the windows may be formed on the elongate walls, e.g. disposed in one or several pair(s) of oppositely-facing windows.

As in the first aspect of the present invention, the windows of the chamber need not be flat. The energy field generator associated to the window can likewise be configured to follow the curvature of the window to provide uniform conditions inside the chamber.

The process chamber according to the second aspect of the invention preferably has a workpiece support means adapted to avoid shadowing the field energy from different windows.

For instance, a peripheral support means may be provided, e.g. mid-way between the windows, and adapted to hold the workpiece at its edges to thus allow exposure of opposite faces.

One or more partitions may be provided inside the chamber to isolate spaces therein associated with one or a group of windows. The spaces can be isolated as regards the gas or gas mixture, the field conditions (e.g. to prevent cross-talk between adjacent energy fields), biasing conditions, or any other process parameter. The chamber can thus be made functionally equivalent to several independent chambers, without having to provide separate pressure-tight vessels. Indeed, the partitions need not be designed to resist to high pressure differentials if their respective gas inlet and outlet means are operated in a co-ordinated manner.

The workpiece support means can be adapted to contribute to the partitioning of the chamber in conjunction with the workpiece(s) by the provision of gas-tight seals at the point of contact between the support means and the workpiece(s). For instance, the aforementioned peripheral support means can itself constitute a part of the partition for the space between the workpiece and the chamber wall, the workpiece per se (e.g. a flat substrate) forming the partition within the peripheral support means. The workpiece can be held by edge grips equipped with sealing gaskets provided on the support means.

This disposition also makes it possible to process simultaneously two faces of a same workpiece (e.g. opposite faces of a substrate) under different conditions, all within a single vacuum envelope. It can be noted that not all the thus-divided spaces need create an environment for plasma processing—one or several of the spaces can be used to process a corresponding surface of a workpiece using other techniques.

The second aspect of the present invention also concerns the use of the above plasma processing chamber for processing workpieces.

According to a third aspect of the present invention, there is provided an apparatus for generating an energy field at a field admission face of an inductively-coupled type plasma processing chamber to create or sustain a plasma within the chamber, characterized in that the apparatus constitutes a closure and gas seal for the field admission face.

The means for generating the energy field in an inductively coupled plasma processing chamber normally comprises structural parts that are in themselves relatively rigid. By a simple adaptation, these means can be thus made to close off and seal the field admission face to which they are associated and thus form a structural part of the vacuum envelope.

The third aspect of the present invention thus makes it possible to obviate the need to provide a pressure-sealed dielectric window for the field admission face of the chamber. The provision of such a window in a classical inductive plasma processing chamber is becoming a problem with the trend towards increased dimensions for the field admission face, since the thickness of the window material has to increase sharply with the surface area exposed to atmospheric pressure. With large field admission faces, the thickness of the dielectric material required imposes a practical limit for further development. Moreover, when the dielectric material has a considerable thickness, the source of field energy cannot be made to act sufficiently close to plasma environment to ensure optimum field strength and uniformity.

By contrast, the third aspect of the present invention makes it possible to bring the inductive field energy source at close proximity to the plasma environment, with minimal losses, irrespective of the size of the field admission opening.

Naturally, the processing chamber according to the third aspect of the invention can have more than one field admission face, by analogy to the field admission windows presented in respect of the second aspect of the invention.

Advantageously, a barrier is formed between the field emission surface of the energy field source and the plasma environment in order to prevent that surface from contaminating the chamber.

The barrier can be in the form of a window or plate made of dielectric material such as quartz, glass e.g. Pyrex (RTM) or even a polymer.

It can be supported, at least at surface portions, by the field emission face of the energy field generator, and therefore need not be as rigid a classical window. The barrier can be supported to the energy field generator by means of adhesives, screws, rivets or mounting brackets.

The barrier may also be in the form of a film deposited on the surface of the field emission face of the energy field generator.

The above-mentioned arrangements ensure that the barrier is in surface contact with the emission face of the field energy generator.

In another embodiment, the barrier is mounted without contacting the field emission face of the energy field generator, being held e.g. at the periphery of the field emission face, or possibly by the process chamber.

In this case, means can be provided to balance the pressure conditions between the inner and outer faces of the barrier (respectively the face turned towards the chamber environment and the face turned towards the energy field generator). These means can be in the form of a valve arrangement operative to allow the pressure at the outer face of the barrier to follow that of the process chamber when the reaction chamber is submitted to changing pressure conditions (e.g. during vacuum pumping or gas admission, or setting to atmospheric pressure for loading and unloading a workpiece). Once the pressure conditions inside the chamber are stabilised, the valve means can be set to seal off the space above the outer surface of the barrier from the reaction chamber to ensure that no contaminant from the energy field generator can reach the plasma environment of the process chamber.

The field energy source can be constructed to be fastenable onto the chamber, with appropriate sealing means being provided at the interface with the chamber. In such a construction, the chamber and field energy source can be arranged to be separable or relatively displaceable through opening and closing means, to provide access to the processing chamber via the field admission opening, e.g. for loading and unloading a workpiece.

Alternatively, the processing chamber and the field energy source can be of unitary construction. In this case too, a dielectric barrier can be provided between the energy field source and the processing space inside the chamber. It can be physically mounted at the level of either the process chamber or the energy field source in the manner explained above, with the optional provision of a pressure equalizing valve arrangement.

According to the third aspect of the present invention, there is also provided a plasma processing apparatus comprising: a processing chamber having at least one field admission face for receiving field energy by inductive coupling, and at least one energy source arranged to induce the field energy into the chamber via a corresponding field admission face, the apparatus being characterized in that the or each energy source forms a sealed cover with respect to its the corresponding field admission face.

The third aspect of the present invention also concerns the use of the above plasma processing apparatus for processing a workpiece.

The first, second and third aspects of the invention can further be implemented with one or more of:

means for biasing the workpiece and/or the field energy source with an ac bias (including radio frequencies), a dc bias or a ground bias, means for heating a workpiece contained in the processing chamber, and means for cooling the field energy source, e.g. the magnetic core.

If means are provided for biasing the field energy source (for instance the pole face structure), the latter is preferably electrically isolated from the structure of the chamber.

The present invention, in any of its first, second or third aspects, can be implemented in a wide variety of applications such as etching;

plasma enhanced or plasma assisted chemical vapour deposition (respectively PECVD or PACVD);

cleaning and surface preparation of workpieces;

passivation; and plasma ion implantation.

Moreover, in implementing the present invention, in any of its first, second or third aspects, the source of atoms for a processing operation can comprise not only a gas or gas mixture, but also other known source technologies such as:

a sputtering source, e.g. a magnetron sputtering source; or a vapour source, e.g. an electron beam evaporator.

Where the invention is implemented with a processing chamber having two or more field admission openings (second aspect of the invention) such that compartments are defined in the chamber, different atom source technologies can be used for different compartments. Likewise, the different compartments may be used for different applications as listed above.

BRIEF DESCRIPTION OF THE DRAWINGS

The invention and its advantages will be better understood from the following description, given as non-limiting examples, of preferred embodiments with reference to the appended drawings, in which:

FIG. 1 shows a plasma processing apparatus formed of a plasma processing chamber 10 and a separate energy field generator 12. The processing chamber 10 is in the form of a shallow cylindrical vessel in which a plasma is to be generated or sustained. In common with classical processing chambers, it comprises a support 14 for a workpiece 16, at least one gas inlet port 18 for introducing a process gas or gas mixture and at least gas outlet port 20 for connection to a pumping device (not shown) to regulate the gas pressure inside the chamber. These aspects are well known in themselves and shall therefore not be detailed for conciseness.

Figure 1:
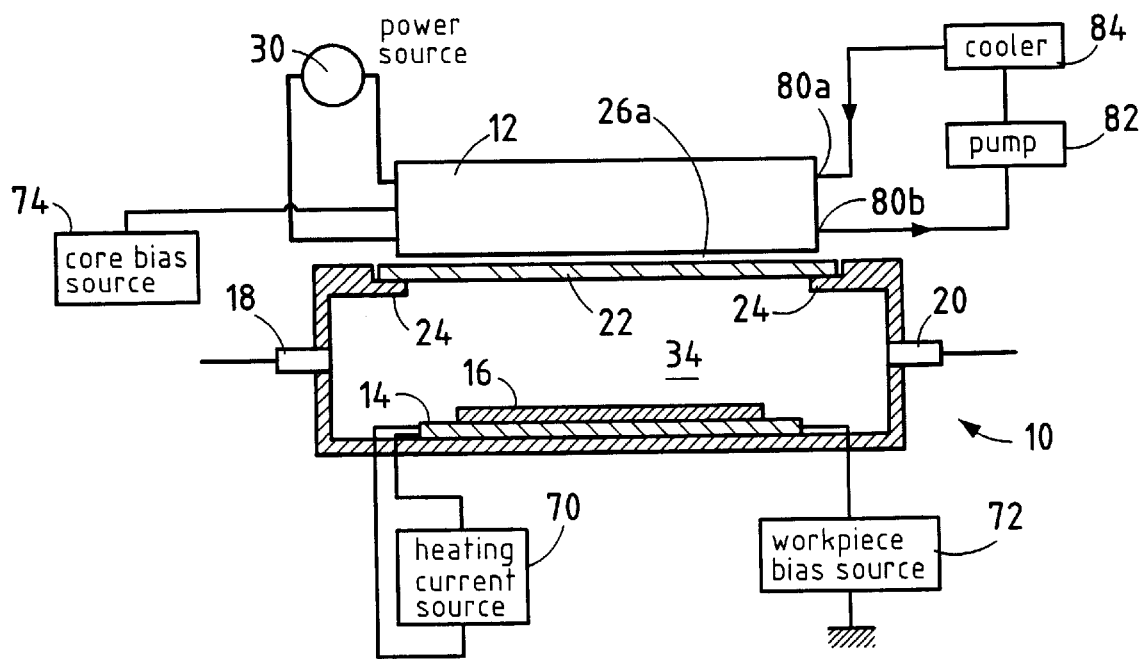
FIG. 1 is a schematic cross-sectional view of a plasma processing apparatus according to a first embodiment of the invention, in conformity with a first aspect thereof.

A top face of the chamber is provided with a window 22 made of quartz or other dielectric material such as to allow an energy field to enter inside the chamber by inductive coupling and thereby create or sustain the required plasma processing conditions. The window 22 is maintained on a rim portion 24 of the chamber 10 through a gas-tight seal.

The rigidity of the window 22 and quality of the seal must be such as to withstand the collapsing force of atmospheric pressure when low pressure gas or partial vacuum conditions exist inside the chamber.

The size of the window 22 determines the area over which the plasma conditions are generated or sustained inside the chamber 10, and consequently the area of the workpiece 16 that can be processed under optimum conditions. In the example, the window 22 occupies almost the entire cross-section of the chamber, enabling the workpiece 16 to occupy a correspondingly large area.

The field energy generator 12 induces a time-varying magnetic field inside the chamber 10 through the window 22. It is provided outside the chamber 10 and against the window, slightly spaced from the latter. The magnetic field is created by a magnetic core 26 in association with an inductor winding 28 (FIGS. 2 to 4) that circulates a current from a high-frequency electrical power source 30.

The magnetic core 26 presents a unipolar face 26a having substantially the same size and shape as the window 22 and positioned in alignment with the latter. To ensure minimum energy loss, the distance between the unipolar pole face 26a and the window 22 is kept small (a few mm) or even zero.

The magnetic core 26 can be made of any ferromagnetic material that can be engineered to the required structural specification or of a magnetic ceramic such as ferrite.

Where a relatively high field frequency is envisaged (e.g. 30 k Hz to 5 MHz and more), the core can be made from a material composed of a magnetic powder and dielectric binder such as sold under the name of "Fluxtrol F" (RTM), from Fluxtrol Manufacturing, Inc. of Troy, Mich., USA. or any other similar material. Such a material has the advantage of providing excellent field uniformity in combination with minimum eddy current losses, without recourse to using a laminated structure.

Figure 2:
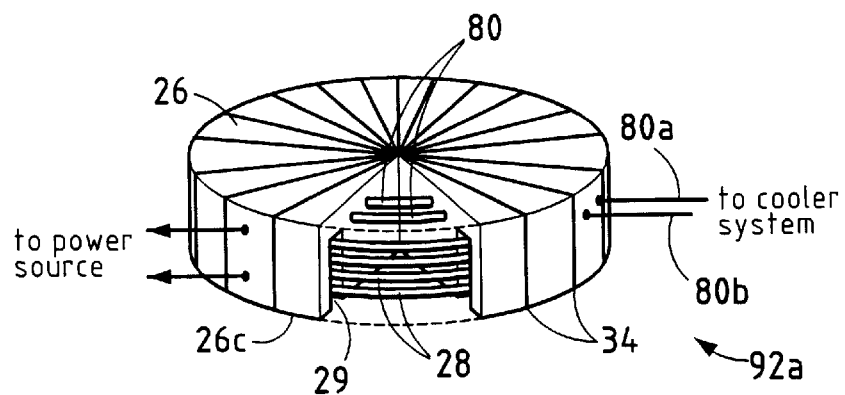
FIG. 2 is a general view of a time-varying magnetic field generator used in the embodiment of FIG. 1.

If the core is made from a material susceptible of eddy current losses, the latter can be eliminated when relatively low frequencies are used by employing a laminated core structure, an example of which is shown in FIG. 2. The laminations 32 are made of insulating material that divide the core 26 into electrically isolating segments radiating from a central portion so as to prevent the circulation of eddy currents. Alternatively, the segments can be separated by an air gap.

In the construction shown in FIG. 2, the inductor 28 comprises a metal tube wound as a coil having one or a number of spires (typically three to ten) of equal radii, concentric with the core 26 and close to the periphery of the latter. The tube can e.g. be made of copper or silver-plated copper and typically has a cross-section of around 5 to 25 mm, possibly more. In the example, the inductor winding is recessed within a groove 29 in the material of the magnetic core 26. The number of spires forming the inductor is determined, inter alia, by the impedance matching with the power source 30.

The power source 30 is of a classical design, comprising a radio-frequency (RF) generator whose power output is connected to the coil 28 via a tuned circuit (not shown) having a capacitive element for impedance and phase factor matching to the load. Typically the generator 30 operates at a frequency of 13.56 MHz, but this value can be e.g. from a few tens of kHz to several tens of MHz depending on the specifics of the design.

The current from the high-frequency power source 30 circulates around the coil 28 and generates a magnetic field whose flux lines are substantially perpendicular to the plane of the coil, at the region within the coil, and hence perpendicular to the window 22. The flux lines alternate at each cycle of the high-frequency current flowing in the coil and create a magnetisation of the core 26 with a polarity that likewise alternates at each cycle. The unipolar pole face 26a of the magnetic core that confronts the window 22 is thus magnetised in alternation between north and south polarities but, at any one moment, possesses the same polarity throughout its area, and is in this respect considered as a unipolar pole face. The high permeability of the core material ensures that the magnetic field lines from the unipolar pole face 26a are of uniform density. The space 34 inside the plasma processing chamber 10—and hence the workpiece 16—experiences a correspondingly uniform plasma environment.

The processing chamber 10 comprises means for heating the workpiece 16 via the workpiece support 14. To this end, the latter is equipped with a heating resistance adapted to be in thermal contact with the workpiece 16 and powered by a controllable heating current source 70. The heating current source 70 operates in conjunction with a temperature sensor (not shown) responsive to the temperature of the workpiece to produce a constant set temperature or a predetermined time-dependent temperature variation according to requirements.

The processing chamber 10 also comprises means for biasing the workpiece 16. In the embodiment, this is accomplished by one or a number of electrical contacts (not shown) at the level of the workpiece support 16 which connect with workpiece either through cable connections or by direct physical contact. The contacts are supplied by a bias source 72 outside the chamber 10 which can be set to provide an ac bias (including radio frequencies), a dc bias or a ground bias.

Similarly, the core 26 can be biased to produce a predetermined potential at the level of the unipolar pole face 26a by means of a separate bias source 74 connected thereto. The bias source can be set to provide an ac bias (including radio frequencies), a dc bias or to ground the core 26.

In the embodiment, the magnetic core 26—and hence its unipolar pole face 26a—are actively cooled by a closed circuit refrigerating system. The latter comprises a fluid circulation conduit 80 embedded in the core 26 and connected via an outlet 80a and inlet 80b to a pump 82 and a cooler 84. As shown in FIG. 2, the conduit 80 can comprise a few turns of piping around a the core 28. For improved heat dissipation, the piping can be associated with fins or equivalent structures embedded in the core.

Figure 3:
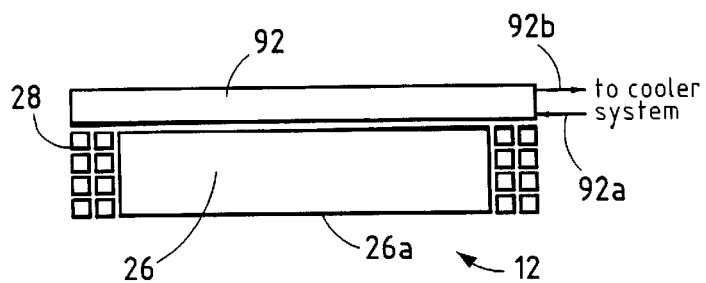
FIG. 3 is a schematic cross-sectional view of a time-varying magnetic field generator used in the embodiment of FIG. 1, according to a first variant.

FIG. 3 shows the magnetic core 26 according to a first variant of the embodiment of FIG. 1, in which the inductor winding 28 is formed around the periphery of the magnetic core 26. In this example, the conductor has a square section and forms two winding layers.

Figure 4:
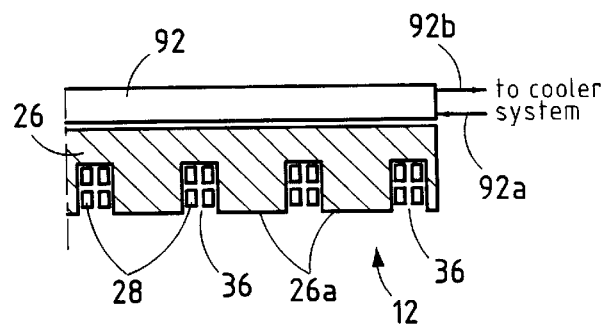
FIG. 4 is a schematic cross-sectional view of a time-varying magnetic field generator used in the embodiment of FIG. 1 according to a second variant.

FIG. 4 shows the magnetic core 26 according a second variant of the first embodiment, in which a groove pattern 36 is formed in the magnetic core 26 to receive the inductor winding 28. In the example, the grooves 36 are exposed on the pole face 26a that confronts the window 22 of the processing chamber 10 and are present substantially throughout that face. As an alternative, the grooves 36 can be formed on the opposite face of the magnetic core. The pattern can form a spiral or concentric closed path following a contour of the magnetic core. The inductor winding 28 is arranged to be completely recessed in the grooves 36, these being sufficiently deep to accommodate one or more stacked winding layers (two in the illustrated example). As in the first variant, the inductor 28 has a square cross-section.

In both the first and second variants, the magnetic core 26 can present a break in the electrical path for eliminating eddy currents, or no such break. Also, the inductor 28 can have a cross-section other than square, e.g. circular.

The core cooling system in the above first and second variants comprises a cooling plate 92 placed in thermal contact with the top surface of the core 26 and inductor winding 28 (i.e. the surface opposite the unipolar pole face 26a). The cooling plate 92 comprises a conduit connected to a cooling system as described in FIG. 1.

The cooling plate can alternatively—or additionally—comprise a heat-sink structure adapted to radiate heat. The heat-sink structure can in this case be associated with a force-air flow.

In the first embodiment and its variants, the geometry of the plasma processing chamber 10—and hence of the magnetic core—is cylindrical. However, the same concepts can be readily transposed to other geometries (square, oblong, oval or polygonal) by simple adaptation.

There will now be described a second embodiment of the plasma processing apparatus according to the present invention by reference to FIG. 5.

The second embodiment differs from the first embodiment essentially by the fact that processing chamber comprises more than one window for admitting field energy, in conformity with a second aspect of the present invention. Each window is disposed so as to allow exposure of different portions of a workpiece to the plasma generating or enhancing effect of the energy field.

Figure 5:
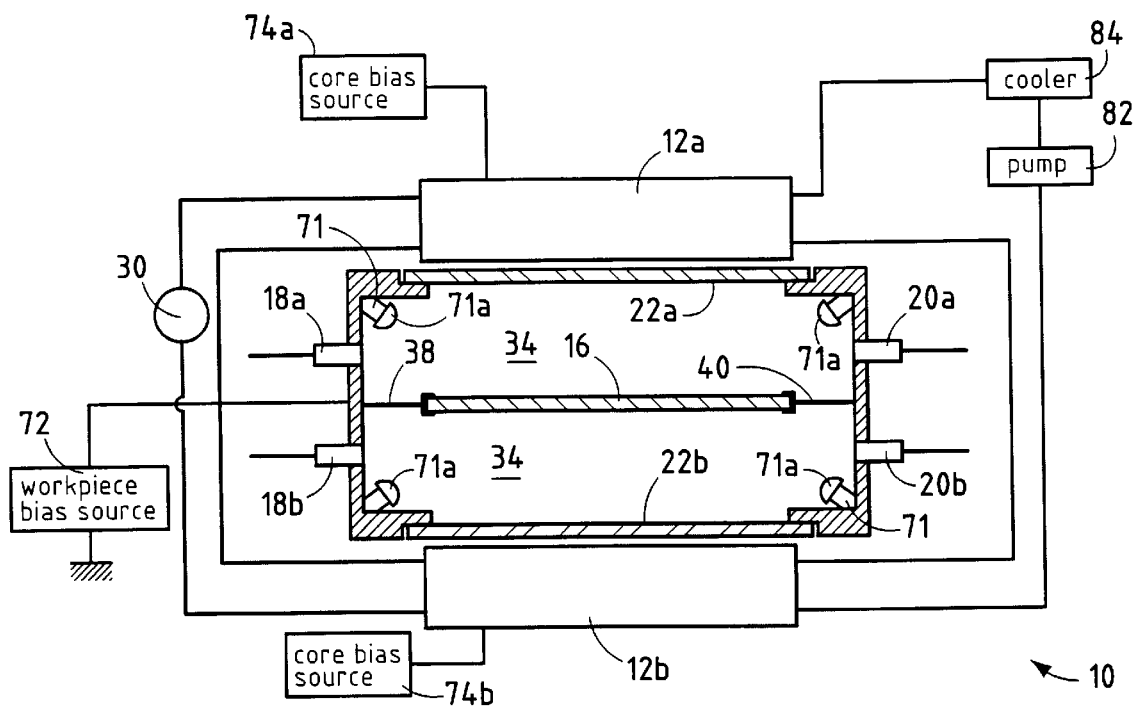
FIG. 5 is a schematic cross-sectional view of a second embodiment of the invention, in conformity with a first and second aspect thereof.

In the example of FIG. 5, the plasma processing chamber 10 has the basic configuration shown in FIG. 1. In this case, however, two windows 22a and 22b are provided, one at each respective end face of the chamber 10.

To each window 22a, 22b is associated an inductive energy source for creating a plasma condition inside the chamber. In the example, the inductive energy source is a time-varying magnetic field generator 12 as in the previous embodiment. However, any other source capable of inducing or of sustaining a plasma condition inside the chamber can be envisaged.

The windows 22a, 22b, time-varying magnetic field generators 12 and mutual disposition between the window and the generator, core biasing and core cooling means are in every respect identical to what has been described in respect of the first embodiment and its variants, and shall therefore not be repeated for conciseness. It can be noted that while the illustrated example provides separate core biasing means 74a, 74b for each time-varying magnetic field generator 12 and common cooling system 82, 84 for the latter, other arrangements can be envisaged.

Also, the first and second variants for the construction of the magnetic core 26 are also applicable to the second embodiment.

The workpiece 16 has upper and lower faces that occupy virtually the entire projected area of the respective windows 22a, 22b. It is held suspended by a support structure 38, mid-way between the two windows, such as to allow each of the upper and lower surfaces to be exposed directly to its respective window. In this way, it is possible to treat both faces of the workpiece 16 simultaneously and under the same optimal conditions with regard to plasma energy generating field induced from the window. It is also possible to process one face of two workpieces placed back-to-back.

The support structure 38 is designed to produce no shadowing of the field energy from either of the two windows 22. In the example, the support structure 38 depends from inner wall portions of the chamber 10, midway between the two end faces. The innermost part of the support structure 38 is equipped with an edge grip or edge rest 40 for the workpiece 16.

In order to ensure homogenous gas flow conditions at each exposed face of the workpiece, separate gas inlets 18a, 18b and outlets 20a, 20b are provided respectively at the upper and lower portions of the processing chamber 10. The upper and lower portions can be open to communicate with each other to allow a uniform mixing of gases.

Alternatively, they can be separated by a sealed partition adapted to surround around the workpiece 16 in a gas-tight manner so that separate gas conditions can be established on respective faces of the workpiece 16. To this end, the workpiece support structure 38 can form a part of the partition in conjunction with the workpiece 16. The edge grips or edge rests 40 can in this case be made to surround the entire periphery of the workpiece 16 and be provided with a gas tight seal at the interface with the edge of the workpiece. The support structure 38 is likewise sealed around the entire periphery of the internal walls of the chamber 10.

As in the first embodiment, means are provided for heating and biasing the workpiece at the level of the support structure 38. In this case, however, heating of the workpiece 16 is effected by means of heating lamps 71 disposed at corners of the chamber 10 so as not to obstruct the field of view from the windows 22a, 22b or otherwise cause shadowing of the energy field. The lamps 71 have a transmission optics 70a or reflector to produce a uniform distribution of heat onto the workpiece 16. Both faces of the workpiece 16 can be heated simultaneously. The electrical connections to the lamps 71 are not shown in the figure.

The workpiece biasing means comprise one or a set of electrical contacts provided on the support structure 38 so as to interface with the workpiece, e.g. at the level of the edge grips 40. The contact(s) are connected to a bias source 72 that can produce either an ac bias (include radio frequencies), a dc bias or a ground bias.

The above-described arrangement of the workpiece heating and biasing means does not interfere with the passage of the energy field to the faces of the workpiece from the respective opposite windows 22a, 22b.

The respective inductors of the time-varying magnetic field generators 26 can be connected in series (as shown in the figure) or in parallel to a common power source 30, with an impedance and phase factor matching circuit adapted as required. Alternatively, they may each be connected to a separate power source.

Figure 6:
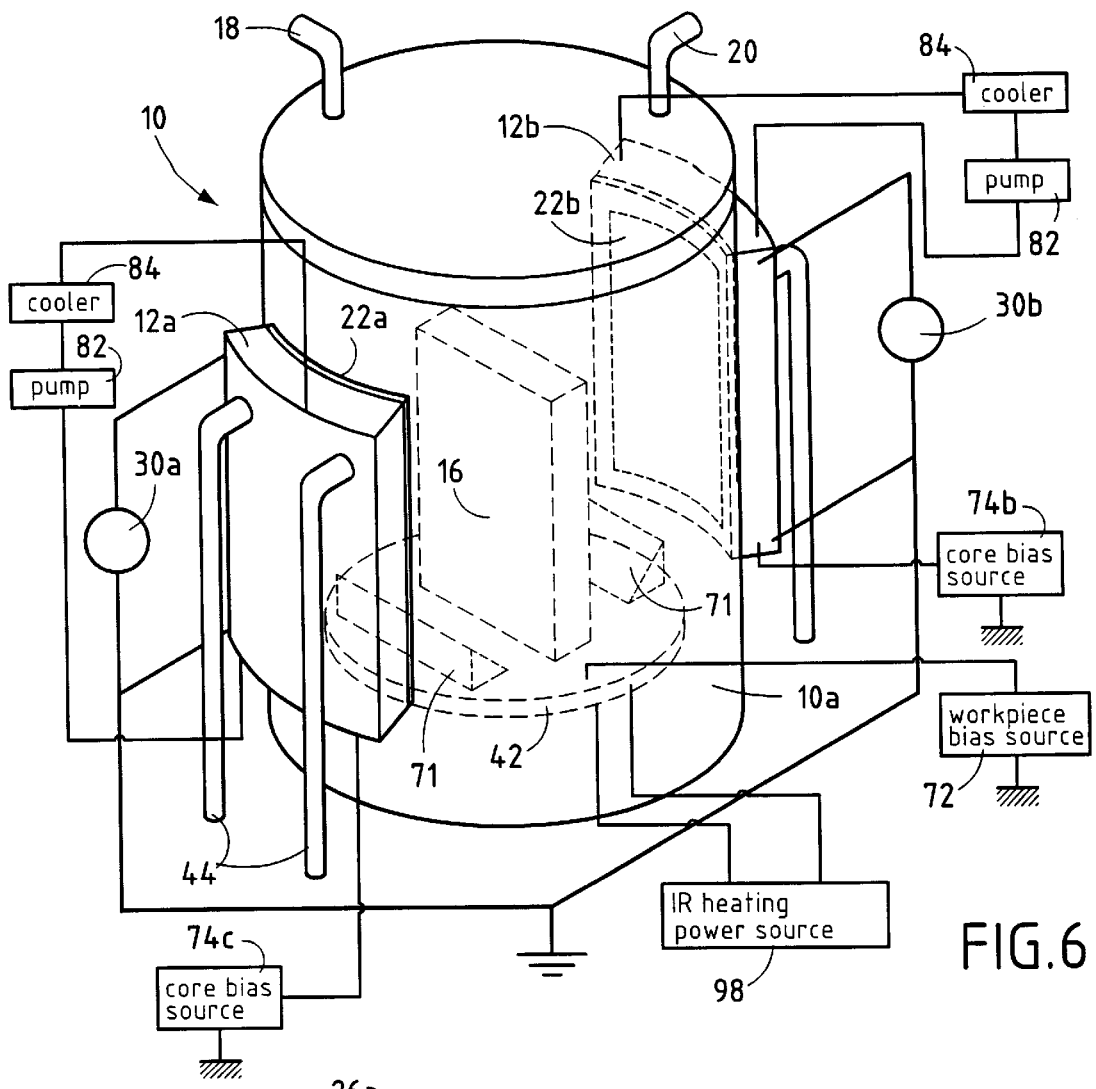
FIG. 6 is a schematic general view of a plasma processing apparatus according to a third embodiment of the invention, in conformity with a first and second aspect thereof.

FIG. 6 shows a third embodiment of the invention adapted to a plasma processing chamber 10 having a cylindrical shape in which the field energy is delivered through the side wall 10a of the chamber. In the example, two field-admission windows 22a, 22b are formed at corresponding openings in the side wall 10a at diametrically opposite positions. The windows 22a, 22b are made of dielectric material such as quartz and provide a pressure-tight seal for the openings. Each window gives direct access to a different surface portion of a workpiece which, in the example, is held inside the chamber by means of a stage 42 arranged to produce no shadowing effect for the energy field from each of the two windows.

Figure 7:
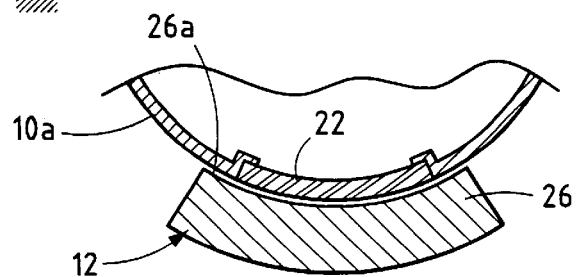
FIG. 7 is a partial plan view of the apparatus of FIG. 6.
Figure 9:
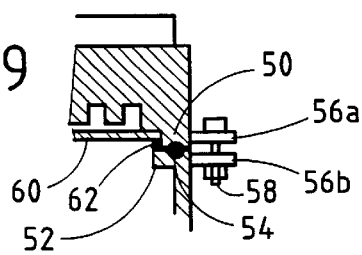
FIG. 9 is a detailed view of the plasma processing apparatus shown in FIG. 8, according to a first variant thereof.

As in the embodiment of FIG. 5, the field energy is provided by a time-varying magnetic generating apparatus 12a, 12b according to the first embodiment or its first or second variants, each apparatus being associated to a corresponding window 22a, 22b. However, the magnetic pole pieces are in this case rectangular cylindrical segments with the unipolar pole face 26a confronting the window curved concentrically with the principal axis of the cylindrical wall of the plasma chamber (FIG. 7). The pole pieces 26 may be flush against their respective window or at a small distance from the latter (FIG. 9). The weight of the pole pieces 26 is supported by a mounting structure 44 separate from plasma processing chamber 10.

As shown in FIG. 6, each core 26 is cooled by independent cooling means 82, 84 based on the embodiment of FIG. 1. Likewise, each core 26 is biased independently.

The workpiece 16 is biased by one or a set of contacts (not shown) on the stage 42 connected to a workpiece bias source 72 providing the same functions as in the above-described embodiments.

Heating of the workpiece 16 is effected by a bank of infrared lamps 71 mounted on the stage 42 and connected to a heating power source 98 to form a classical infrared heater. Additional infrared heating lamps can be provided inside the chamber 10 at locations where they do not obstruct the energy field reaching the workpiece 16 from the different windows 22a, 22b.

Although the figure shows the chamber to have two energy field admission windows 22a, 22b, it is clear that more windows can be provided in the same manner if required, in conformity with the second aspect of the present invention. For instance, the chamber 10 can be provided with four, equally spaced windows e.g. for processing four faces at right angles of a workpiece or one face of four workpieces.

Figure 8:
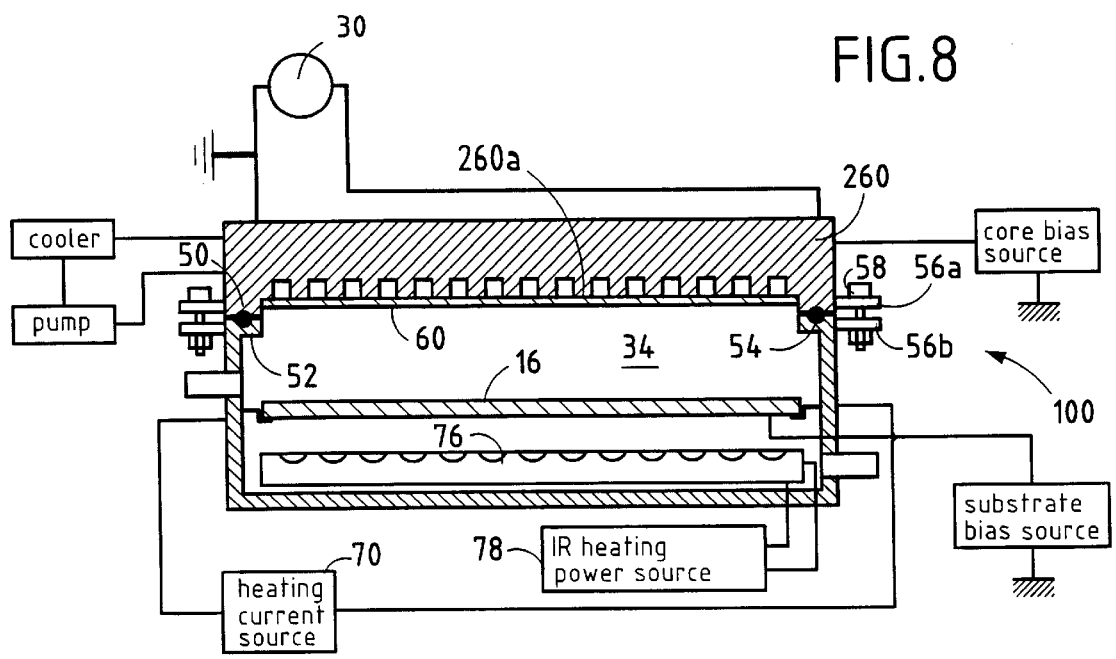
FIG. 8 is a schematic cross-sectional view of a plasma processing apparatus according to a fourth embodiment of the invention, in conformity with a first and third aspect thereof.

FIG. 8 shows a fourth embodiment that corresponds to a third aspect of the present invention, in which a source of inductive field energy 260 is used to close off and seal the field admission opening of the processing chamber 100. In the example, the source of inductive field energy 260 is electrically isolated from the general structure of the processing chamber.

The plasma processing chamber 100 is similar to the one illustrated in FIG. 1 as regards the relative dimensions, and the gas inlet 18 and outlet 20 and core biasing means. The workpiece 16 is biased in the manner described with reference to FIG. 5. These aspects will therefore not be described again for conciseness.

In the example, the workpiece 16 is heated by an infrared heating device 76 beneath the workpiece and connected to an infrared heating power source 78. Alternatively, the workpiece 16 can be made to rest on a stage, in which case it can be heated by thermal contact with the stage, as in the embodiment of FIG. 1.

In the figure, the inductive field energy field source 260 is a time-varying magnetic field generator. The core 260 of the generator has a pole face 260a and inductor winding corresponding to the second variant of the first embodiment. The periphery of the magnetic core 260 defines a shoulder portion 50 that rests on a corresponding rim portion 52 around the opening of the process chamber via a sealing gasket 54. Respective flanges 56a, 56b project outwardly from the shoulder 50 and the rim portion 52 to hold and tighten the magnetic core 260 against the process chamber 100 by nut-and-bolt fasteners 58 to ensure a proper seal by the gasket 54. The magnetic core 260 is electrically isolated from the mechanical structure forming the chamber 10 so that it can be biassed by the bias source 74 independently of the chamber. In the example, the electrical isolation is effected by the sealing gasket 54.

A dielectric material sheet 60 e.g. of quartz, glass such as Pyrex (RTM) a ceramic or polymer is provided between the pole face 260*a* and the space inside the chamber 100 to prevent possible contamination of the plasma gas by the pole face material. In the example, the sheet 60 is applied against the pole face 160*a* and held by the latter, e.g. by adapted mounting brackets. Alternatively, the sheet of dielectric material 60 may be maintained without contacting the pole face 160*a,* e.g. by means of a peripheral mounting recess 62 formed at the shoulder portion 50 of the magnetic core 260, as shown in FIG. 9.

In this case, means may be provided to equalize the pressures respectively at the space between the outer face of the sheet 60 and the pole face 260*a* and at the space between the inner surface of the sheet and the inner walls of the chamber 10. Such means can be in the form of a simple opening or group of openings, or a valve arrangement, e.g. at an edge of the sheet.

If a valve is used, means may be provided to control the latter such that a pressure equalization can take place whilst the chamber is being prepared e.g. during gas exhaustion and establishing the process gas conditions, but closed when a plasma process is being performed, so as to prevent any contaminant from the energy field source reaching the process gas.

The dielectric sheet 60 experiences the same pressure on both of its sides and need not therefore be rigid to the extent required for a window that has to withstand atmospheric pressure. In this case, the force of atmospheric pressure is supported by the magnetic core 260, which is normally sufficiently rigid for that purpose. If needs be, the core can be strengthened to ensure that it does not distort significantly when submitted to a pressure differential of one atmosphere.

Depending on operating conditions, it may be necessary to take appropriate measures to avoid a plasma being formed in the space between the dielectric sheet 60 and the pole face 260*a*. One solution is to ensure that the gap between the dielectric sheet and the pole face is kept as small as possible, e.g. less than 1 mm, possibly less than 0.5 mm.

Figure 10:
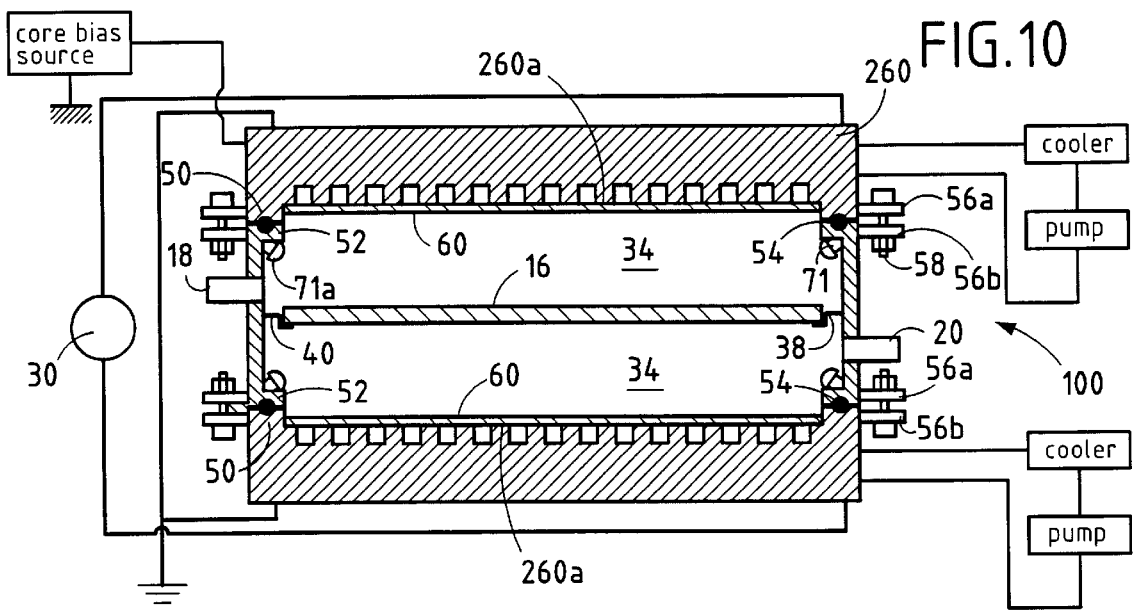
FIG. 10 is a schematic cross-sectional view of a plasma processing apparatus according to a fifth embodiment of the invention, in conformity with a first, second and third aspect thereof.
Figure 12:
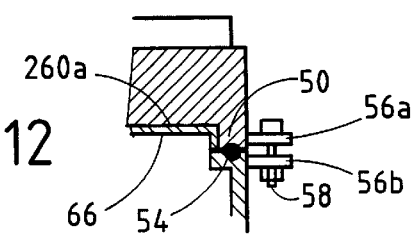
FIG. 12 is a detailed view of the plasma processing apparatus shown in FIG. 8 or FIG. 10, modified according to a second variant thereof.

FIG. 10 is a partial plan view of a fifth embodiment which is analogous to the fourth embodiment but applied to the case where the process chamber has two energy field admission openings as in the case of FIG. 6.

In the example, the workpiece 16 is heated by infrared lamps 71 analogous in form and disposition to those described with reference to FIG. 5.

Figure 11:
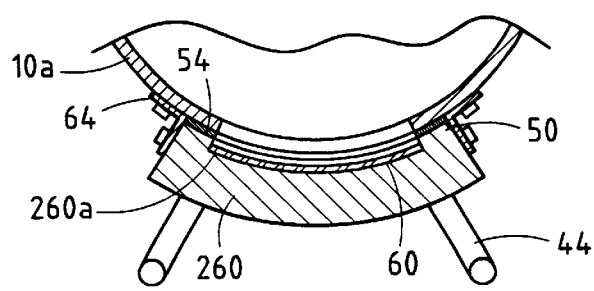
FIG. 11 is a partial plan view of the apparatus shown in FIG. 6, modified according to a sixth embodiment of the invention, in conformity with a first, second and third aspect thereof.

FIG. 11 is a partial plan view of a sixth embodiment in which the plasma processing apparatus of FIG. 6 is modified by having the openings closed off and sealed by the field energy source, as in the fourth and fifth embodiments.

In the figure, the magnetic core 260 has a peripheral shoulder portion 50 that presents a contact face adapted to fit against the portion of the chamber wall 10*a* around the opening via a gasket 54 to offer a gas-tight seal. The magnetic core 260 and gasket 54 are fixed onto the chamber wall by a peripheral mount 64. The weight of the magnetic core 260 is additionally supported by the independent support structure 44 shown in FIG. 6.

In the example, the dielectric material sheet 60 is conformed to the curvature of the pole face 260 and is supported by the latter. It may alternatively be maintained spaced from the pole face e.g. by a peripheral recess similar to the one shown in FIG. 9.

Naturally, this embodiment is applicable to other geometries and to chambers having just one, two, or more field energy admission openings.

FIG. 11 is a detailed view of a variant, illustrated in the context of the fourth or fifth embodiments, but equally applicable to the sixth embodiment. Here, a dielectric film 66 replaces the dielectric sheet. In the example, the inductor is recessed within a groove structure in the magnetic core 260 and the pole face 260*a* thus presents a continuous surface. The film 66 can be made of the same material as the aforementioned dielectric sheet and deposited by conventional techniques over the pole face 260*a* and, if required, also over the shoulder portion 50. This variant can also be implemented in cases where the pole face 260*a* presents a groove pattern, such as shown in FIG. 4 or other discontinuities. In this case, suitable measures may be taken to ensure that the features in the grooves or discontinuities are not exposed to the environment inside the chamber if such an exposure were undesirable. For instance, the film 66 can be made to conform with the surface of those features.

It will be apparent to the person skilled in the art that features of the different embodiments and their variants can be interchanged and combined where practical without departing from the scope of the claims.

The second and third aspects of the invention respectively based on the provision of plural openings in the process chamber and the use of the energy source to close off and seal the field admission openings can be implemented with all suitable known field energy sources that can provide sufficient structural strength to support the pressure differential. These include, inter alia, generators based on rigid wound conductors that generate an RF field in the chamber without a magnetic core structure. In this case, the sealing surfaces and dielectric window mount can be formed integrally with conductors.

What is claimed is:

1. An apparatus for inducing an energy field into an inductively-coupled type plasma processing chamber via an opening of said chamber to create or sustain a plasma within the chamber,
    said apparatus comprises an inductor means associated with a magnetic core, said magnetic core forming a closure and gas seal for said opening.

2. Apparatus according to claim 1, further comprising a barrier formed between a field emission surface and the plasma environment in order to prevent that surface from contaminating the chamber.

3. Apparatus according to claim 2, wherein the barrier is a window made of a dielectric material which is quartz, glass or a polymer.

4. Apparatus according to claim 2, wherein the barrier is supported, at least at surface portions, by a field emission face thereof.

5. Apparatus according to claim 2, wherein the barrier comprises a film deposited on the surface of a field emission face thereof.

6. Apparatus according to claim 2, wherein the barrier is mounted without contacting a field emission face thereof, the barrier being held at the periphery of the filed emission face, or by the process chamber.

7. Apparatus according to claim 2, wherein pressure adjustment means are provided to balance the pressure conditions between the inner and outer faces of the barrier.

8. Apparatus according to claim 7, wherein the pressure adjustment means comprise a valve arrangement operative to allow the pressure at the outer face of the barrier to follow that of the process chamber when the latter is submitted to changing pressure conditions, and to seal off the space above the outer surface of surface of the barrier when the chamber is operative for plasma processing to ensure that no contaminant from the energy field generator can reach the plasma environment of the process chamber.

9. Apparatus according to claim 1, further comprising releasable fastening means for fastening onto the chamber, and sealing means provided at the interface with the chamber.

10. Apparatus according to claim 1, further comprising opening and closing means to provide access to the processing chamber via the field admission opening(s).

11. Apparatus according to claim 1 forming a unitary construction with the processing chamber.

12. Apparatus according to claim 1, further comprising means for biasing a workpiece inside the chamber with at least one of: an ac bias (including radio frequencies), a dc bias, and a ground bias.

13. Apparatus according to claim 1, further comprising means for heating a workpiece in the chamber.

14. Apparatus according to claim 1, further comprising cooling means.

15. A plasma processing apparatus comprising:

a processing chamber having at least one opening for receiving field energy by inductive coupling, and at least one field energy source arranged to induce the field energy into the chamber via the corresponding opening, wherein said field energy source comprises an inductor means associated with a magnetic core, said magnetic core forming a closure and gas seal for the corresponding opening.

* * * * *